United States Patent [19]
Yabusaki et al.

[11] Patent Number: 5,107,216
[45] Date of Patent: Apr. 21, 1992

[54] NUCLEAR MAGNETIC RESONANCE IMAGING APPARATUS

[75] Inventors: Masao Yabusaki, Tokyo; Etsuji Yamamoto, Akishima; Hiroyuki Takeuchi, Kashiwa; Hideki Kohno, Tama, all of Japan

[73] Assignees: Hitac Hi, Ltd.; Hitachi Medical Corporation, both of Tokyo, Japan

[21] Appl. No.: 473,428

[22] Filed: Feb. 1, 1990

[30] Foreign Application Priority Data

Feb. 3, 1989 [JP] Japan .................................. 1-23908

[51] Int. Cl.$^5$ .......................................... G01R 33/20
[52] U.S. Cl. ..................................... 324/318; 324/322
[58] Field of Search ............... 324/318, 322, 307, 309, 324/320; 128/653 SC

[56] References Cited
U.S. PATENT DOCUMENTS 4,641,097  2/1987  Bottomley et al. .................. 324/318
4,740,752  4/1988  Arakawa et al. .................... 324/318
4,825,163  4/1989  Yabusaki et al. .................... 324/318
4,875,013  10/1989  Murakami et al. .................. 324/318

Primary Examiner—Hezron E. Williams
Assistant Examiner—Louis M. Arana
Attorney, Agent, or Firm—Antonelli, Terry, Stout & Kraus

[57] ABSTRACT

In an imaging apparatus using the nuclear magnetic resonance, a solenoid coil and a slot-resonator coil are combined with each other so as to constitute a quadrature-phase detection probe. In order to operate the slot-resonator coil at low frequency, inductance is added to the slot-resonator coil. Further in order to cut the coupling between a transmitting coil and a receiving coil in a cross coil system, a capacitor together with the added inductance to form a resonant circuit is connected in parallel to the inductance. A favorable probe can be obtained in a vertical-magnetic field type imaging apparatus.

11 Claims, 11 Drawing Sheets

FIG. 1
PRIOR ART
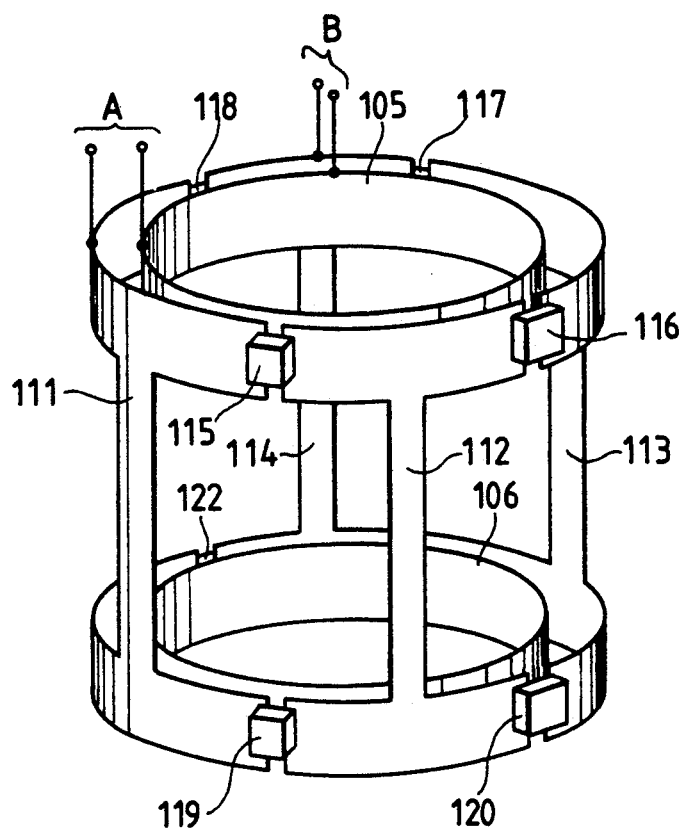
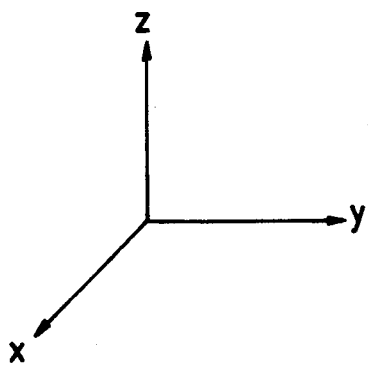

FIG. 3
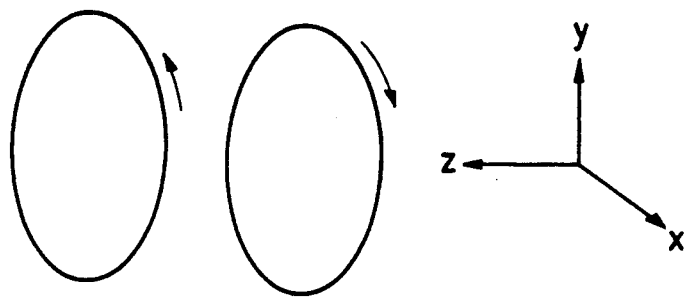
Gz
(COIL 12)
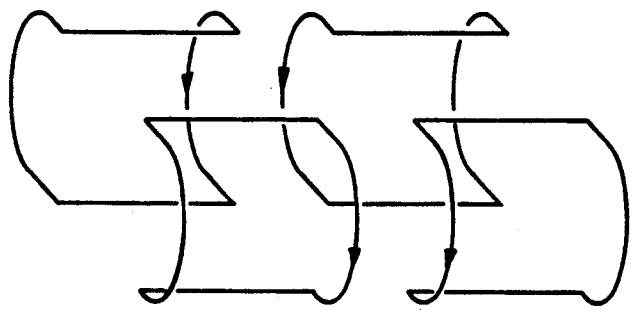
Gx
(COIL 13)
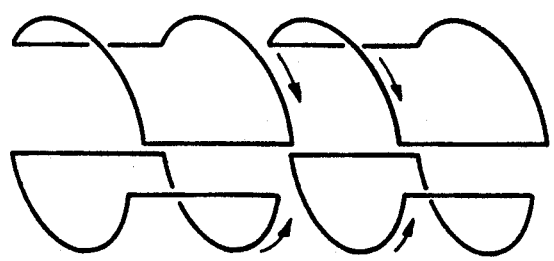
Gy
(COIL 14)

NUCLEAR MAGNETIC RESONANCE IMAGING APPARATUS

BACKGROUND OF THE INVENTION

The present invention relates to an imaging apparatus using the nuclear magnetic resonance where a quadrature-phase detecting probe constituted by combination of a solenoid coil and a slot-resonator coil is used as a signal detection device.

In the prior art, an X-ray CT and an ultrasonic imaging apparatus have been used as an apparatus for the nondestructive inspection of an internal structure such as of a human brain and abdomen. In recent years, trial to image the internal structure of an object using a nuclear magnetic resonance (hereinafter abbreviated as "NMR") phenomenon succeeds thereby many sorts of information can be obtained although not obtained by an X-ray CT or an ultrasonic imaging apparatus. In an imaging apparatus using the NMR phenomenon, a signal from an object to be inspected must be separated and discriminated for each position of the object to be inspected. As one such method, a gradient magnetic field is applied to an object to be inspected thereby the magnetic field intensity in each position of the object is made different hence a resonant frequency or a phase encoding value in each position is made different so as to obtain information of the position.

DESCRIPTION OF THE PRIOR ART

The basic principle of this method is described in detail in "Journal of Magnetic Resonance", vol. 18, pp. 69-83 or "Physics in Medicine & Biology", vol. 25, pp. 751-756.

In the imaging as above described, improvement of the efficiency of the probe coil for generating or receiving a high-frequency magnetic field becomes the important problem leading to improvement of the picture quality and decrease of the image pick-up time. As one means to solve the problem, a quadrature-phase detection probe coil (hereinafter abbreviated as a "QD probe") is described in "Journal of Magnetic Resonance", vol. 69 (1987), pp. 236-242.

The prior art as above described is effective as a QD probe in a horizontal-magnetic field type imaging apparatus using NMR (hereinafter abbreviated as a "horizontal-magnetic field type MRI apparatus"). A bird's eye view of a QD probe in the prior art is shown in FIG. 1. The QD probe in the prior art is constituted by two sets of guard rings 105, 106, and signal electrodes 111, 112, 113, 114 opposed to the guard rings 105, 106 through an insulator such as polytetrafluorethylene (omitted in FIG. 1), and has a structure such that capacitors 115 - 118, 119 - 122 are connected between respective signal electrodes. This may be considered to be a structure such that a first slot-resonator coil constituted by the signal electrodes 111, 113 and the two guard rings and a second slot resonator constituted by the signal electrodes 112, 114 and the two guard rings are combined in the perpendicular direction.

In the QD probe shown in FIG. 1, signals from feeding points A, B are added after the phase difference between them is compensated thereby the QD probe has sensitivity in the direction within the xy plane. In this case, from the principle of the nuclear magnetic resonance, the direction of the magnetic field is the z axis direction. Also the human body inserting direction is assumed to be the z-axis direction. Since the cylinder center axis of the probe and the human body inserting direction are coincident, the human body shape and the probe shape are coincident. Consequently the signal detection efficiency is improved.

SUMMARY OF THE INVENTION

If the probe in this state is applied to a vertical-magnetic field type imaging apparatus using NMR (hereinafter abbreviated as a "vertical-magnetic field type MRI apparatus"), the human body must be inserted between portions of the signal electrode in parallel to the cylindrical axis (hereinafter referred to as "vertical electrodes"). Consequently, the signal detection efficiency is lowered and the adoption of the QD probe becomes meaningless. That is, the QD probe shown in FIG. 1 cannot be applied to the vertical-magnetic field type MRI apparatus.

An object of the invention is to provide a QD probe which can be applied to a vertical-magnetic field type MRI apparatus.

In order to attain the foregoing object, according to the invention, a solenoid coil and a slot-resonator coil are combined so as to constitute a QD probe.

Also since the slot-resonator coil is operated at low frequency, inductance is added to an arm section of the slot-resonator coil.

Further, in order to decouple a transmitting coil and a receiving coil in a cross coil system, together with the added inductance, a capacitor resonated in the resonant frequency of the slot-resonator coil is connected in parallel to the added inductance. Also a switch is installed so that the operation of the resonant circuit constituted by the added inductance and the capacitance can be controlled at the transmitting state and the receiving state. The switch acts so that the resonant circuit resonates at the transmitting state and does not resonate at the receiving state. As a result, the coupling between the transmitting coil and the receiving coil at the transmitting state can be cut.

The switch is constituted by paired diodes, thereby the resonant circuit is controlled so that it resonates at the transmitting state and does not resonate at the receiving state.

Also the arm section of the slot-resonator coil is constituted by a slender conductor such as a copper pipe and the like, thereby overlapping between the slot-resonator coil and the solenoid coil is made as small as possible. Consequently, coupling between both coils can be made small to such degree that it does not become a problem in practice.

Further an overlapping part of the solenoid coil to the slot-resonator coil is also constituted by a slender conductor, thereby the coupling between both coils can be further made small.

Since the solenoid coil has the sensitivity in the human body inserting direction and the slot-resonator has the sensitivity in the direction perpendicular to the human body inserting direction, a QD probe can be constituted.

In the vertical-magnetic field type MRI apparatus, low magnetic field intensity of usually 0.05-0.3 tesla or the like is used and the nuclear magnetic resonant frequency also becomes low.

Since inductance is added to the arm section of the slot-resonator coil and therefore the resonant frequency of the slot-resonator coil can be easily lowered, the coil can be applied to the vertical-magnetic field type MRI apparatus.

Further in the cross coil system where the transmitting and the receiving are performed by separate coils, inductance and capacitance added to the slot-resonator coil constitute a parallel resonant circuit and are controlled to resonate by a switch. As a result, impedance across the added inductance becomes high at the transmitting state and therefore the coupling between the transmitting coil and the slot resonator coil can be cut. If paired diodes are used as this switch, they are turned on at the transmitting state due to application of a large voltage thereby the resonant circuit becomes the resonant state. At the receiving state, since only a small voltage is applied, the paired diodes are at the open state thereby the resonant circuit does not become the resonant state. As a result, the signal receiving can be performed by the slot-resonator coil.

If the overlapping exists at the signal detection portion of the solenoid coil and the slot-resonator coil, the QD probe cannot be constituted. However, when the arm section of the resonator coil is constituted by a slender conductor such as a copper pipe or the like, the overlapping of both coils can be made small hence the coupling between both coils can be made small. Further the overlapping portion for the solenoid coil is also constituted by a slender conductor, thereby the coupling between both coils can be made smaller.

According to the invention, the QD probe can be constituted in the vertical-magnetic field type MR apparatus and the sensitivity uniformity can be improved.

Also since a self-resonant frequency of the slot-resonator coil can be lowered, the resonant frequency of the QD probe can be lowered without deterioration of characteristics.

Further since the coupling between the transmitting coil and the receiving coil in the cross coil system can be avoided, the QD probe can be applied to both the single coil system and the cross coil system.

BRIEF DESCRIPTION OF THE DRAWINGS

In the accompanying drawings:

FIG. 1 is a bird's eye view of a QD probe in the prior art;

FIG. 3 is a diagram showing a constitution of a gradient coil in the horizontal-magnetic field type MRI apparatus of FIG. 2;

DETAILED DESCRIPTION OF EMBODIMENTS

Embodiments of the invention will now be described referring to the accompanying drawings.

Figure 2:
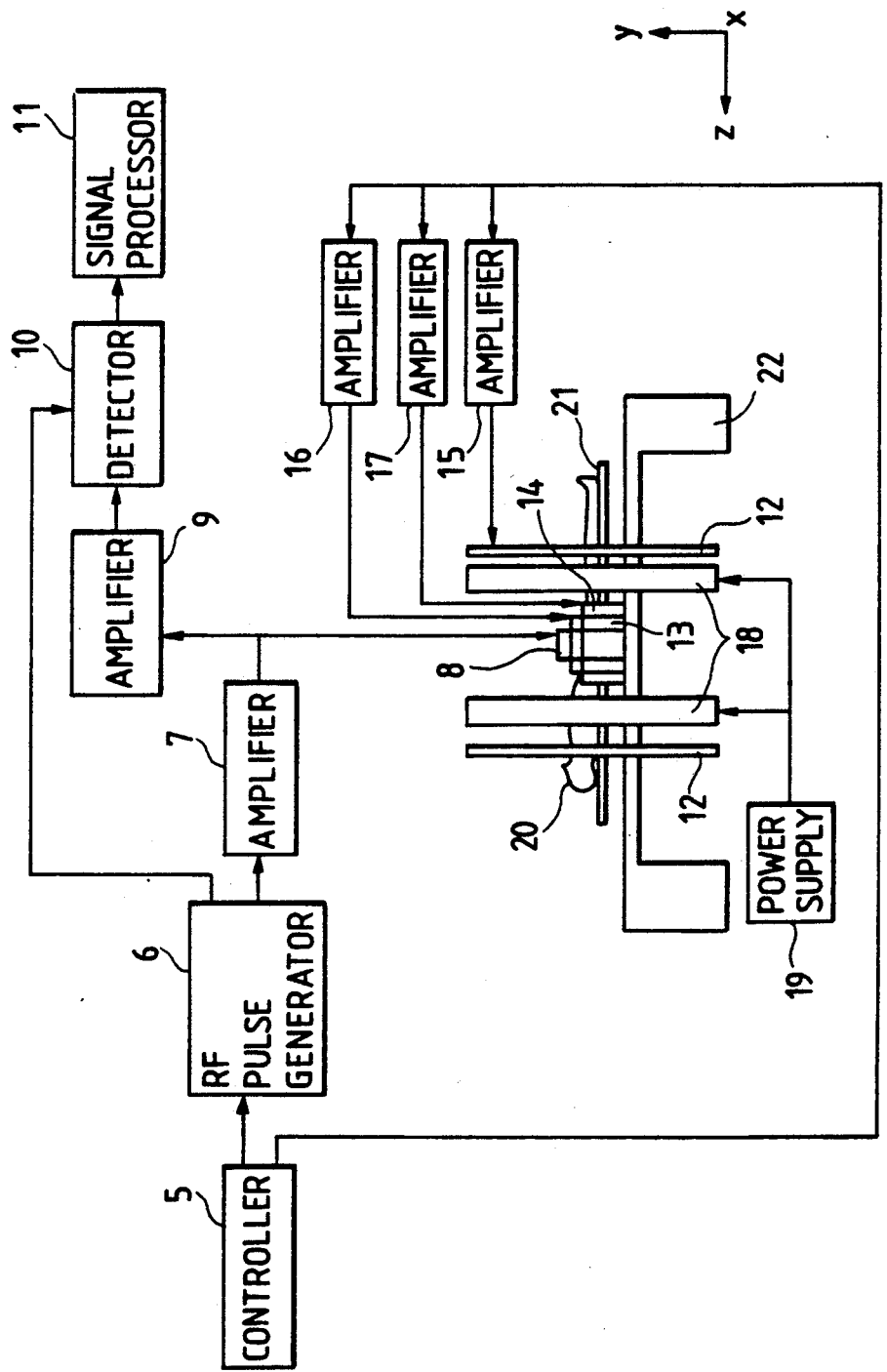
FIG. 2 is a block diagram of the whole body of a horizontal-magnetic field type MRI apparatus.

FIG. 2 is a block diagram showing an example of a horizontal-magnetic field type MRI apparatus in single coil system where the transmitting and the receiving are performed by one coil. In a vertical-magnetic field type MRI apparatus used in an embodiment of the invention, the direction of a static magnetic field is not horizontal but vertical, however, FIG. 2 will be first described for understanding the MRI apparatus as a whole. A controller 5 outputs various instructions to each of the following units in the definite timing. Output of an RF (radio frequency) pulse generator 6 is amplified by an amplifier 7 and then drives a coil 8. Signal component received by the coil 8 passes through an amplifier 9 and is detected by a detector 10, and then converted into image by a signal processor 11. Gradient magnetic fields in the z-direction and directions perpendicular thereto are generated by coils 12, 13, 14 respectively, and these coils are driven by amplifiers 15, 16, 17 respectively. The static magnetic field is generated by a coil 18, which is driven by a power supply 19. The coil 14 has the same constitution as that of the coil 13, and the coil 14 is rotated by 90 degrees about the z axis with respect to the coil 13 thereby gradient magnetic fields perpendicular to each other are generated. A human body 20 to be inspected is put on a bed 21, which is moved on a supporter 22. FIG. 3 shows an example of constitution of coils generating the gradient magnetic fields in FIG. 2 and direction of current flowing therethrough. In this example, the coil 12 generates the gradient magnetic field in z-axis direction, the coil 13 generates the gradient magnetic field in x-axis direction, and the coil 14 generates the gradient magnetic field in y-direction.

In practice, the coils 12, 13, 14 are used in winding on one cylindrical bobbin.

Figure 4:
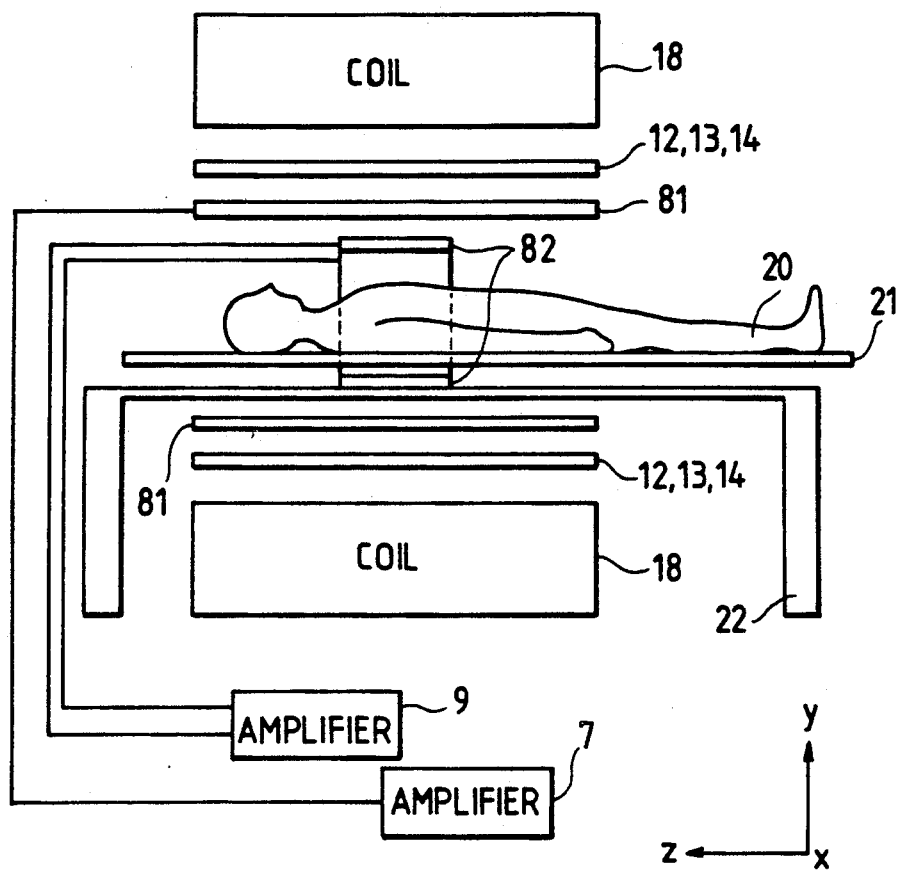
FIG. 4 is a block diagram showing a constitution of an electric magnet and parts at its vicinity in a vertical-magnetic field type MRI apparatus.

FIG. 4 is a block diagram showing a constitution example of a vertical-magnetic field type MRI apparatus. A controller 5, an RF pulse generator 6, a detector 10, a signal processor 11, amplifiers 15, 16, 17 and a power supply 19 have the same connection as that in FIG. 2, and therefore are not shown in FIG. 4. FIG. 4 shows a cross coil system where the transmitting and the receiving are performed by separate coils. In the cross coil system, the output of the RF pulse generator 6 is amplified by an amplifier 7 and then excites a transmitting coil 81. A signal component received by a receiving coil 82 passes through an amplifier 9 and is detected by the detector 10. A detailed constitution example of coils 12, 13, 14 generating the gradient magnetic fields shall be omitted here. In FIG. 4, the coils 12, 13, 14 generating the gradient magnetic fields are drawn simplifying in one coil.

Figure 6A:
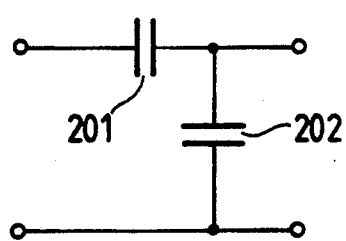
FIGS. 6(a) and 6(b) are circuit diagrams showing an example of a matching circuit.
Figure 6B:
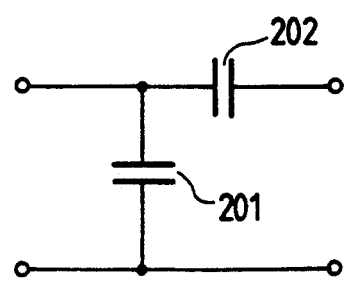
Figure 5:
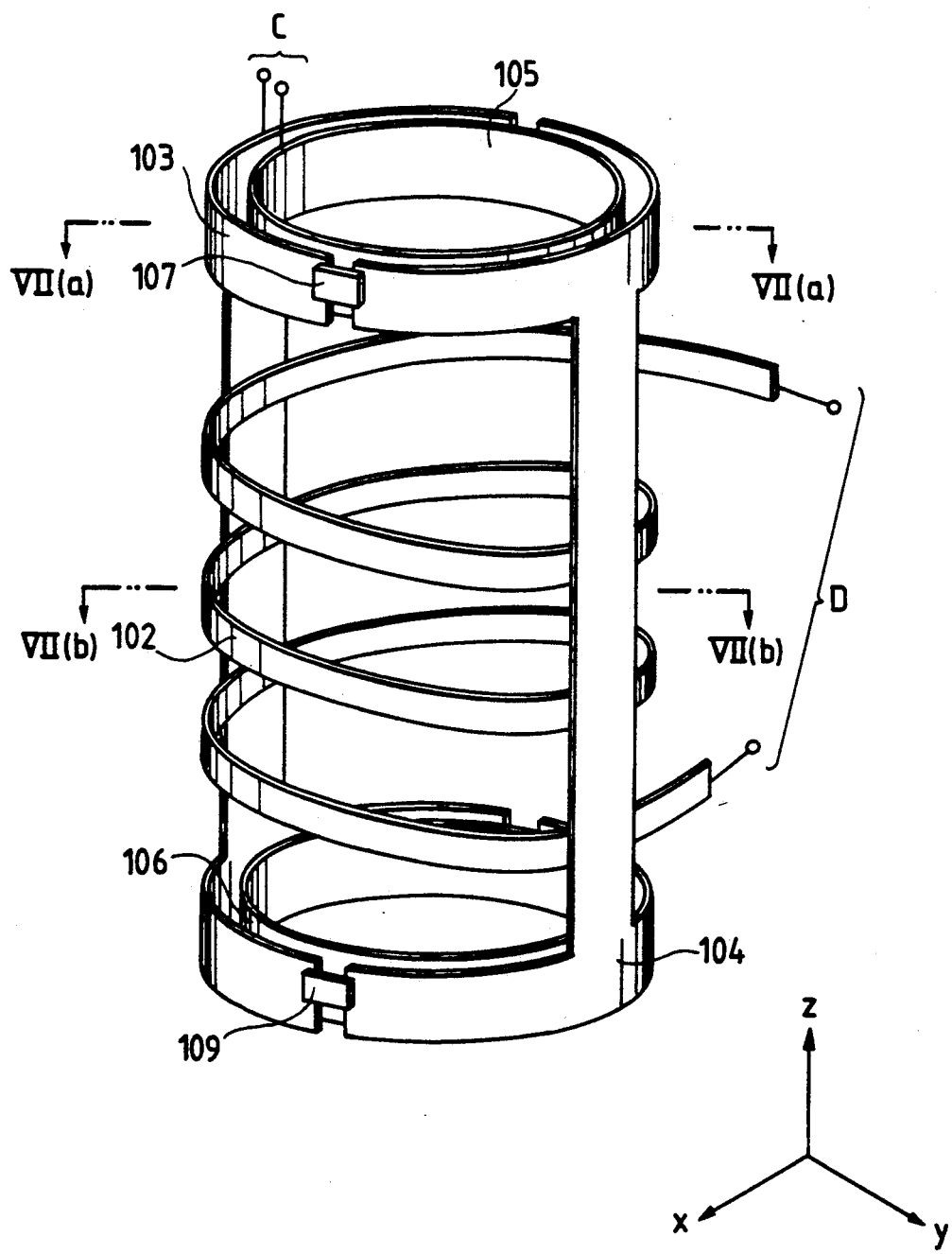
FIG. 5 is a bird's eye view showing a receiving coil being the main part of an embodiment of the invention.

FIG. 5 is a constitution diagram of a receiving coil being the main part of an embodiment of the invention. In the embodiment, a slot-resonator coil is wound on the outside of a solenoid coil 102 (In FIG. 5, a bobbin of insulating material supporting the solenoid coil 102 is not shown.). In the slot-resonator coil, signal electrodes 103, 104 in the form of conductive arms are wound on upper and lower guard rings 105, 106 through an insulator (not shown in FIG. 5). Among the signal electrodes 103, 104, an opposed portion (called a wing) to the guard rings 105, 106 is connected by capacitors 107, 108, 109, 110. In the case of FIG. 5, the sensitivity of the solenoid coil is in the z-axis direction and the sensitivity of the slot-resonator coil is in the x-axis direction. That is, if the static magnetic field is taken in the y-axis direction, a QD probe can be constituted in combination of the solenoid coil and the slot-resonator coil. Consequently, the sensitivity uniformity in the signal detecting can be improved. Although a matching circuit leading to feeding points C and D is not shown in FIG. 5, a matching circuit by capacitors 201, 202 shown in FIG. 6(a) or FIG. 6(b) may be used.

However, both the solenoid coil and the slot-resonator coil are designed so as to resonate in the desired resonant frequency.

Figure 7A:
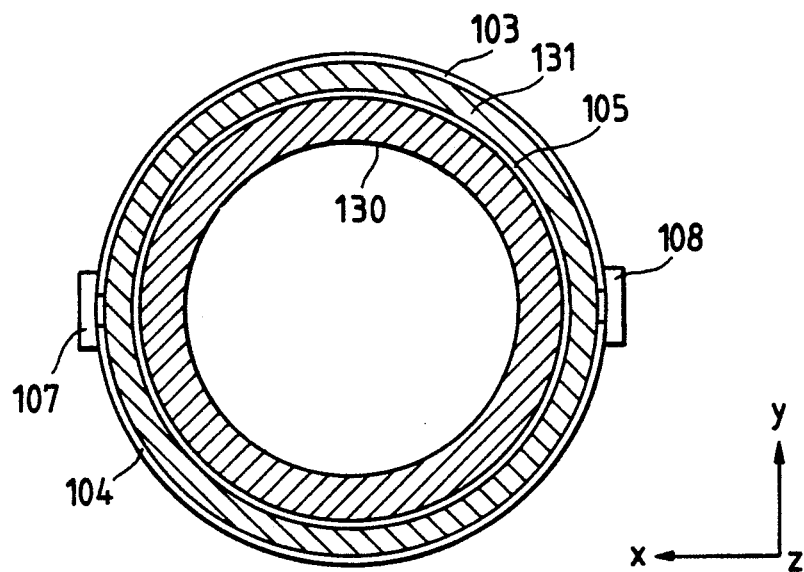
FIGS. 7(a) and 7(b) are sectional views along lines VII(a)-VII(a) and VII(b)-VII(b) of FIG. 5, respectively.
Figure 7B:
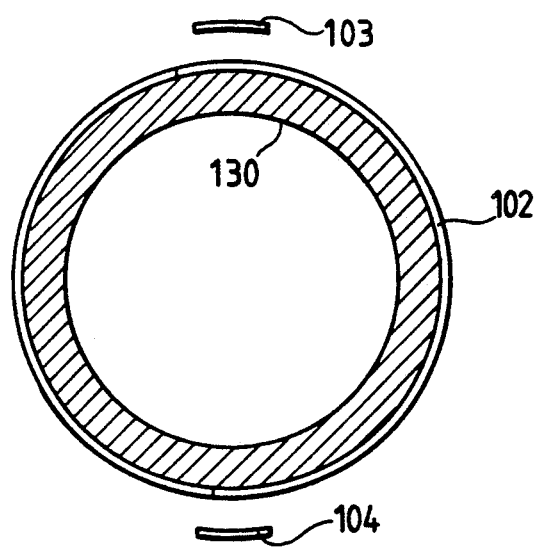

FIGS. 7(a) and 7(b) are sectional views taken along lines VII(a)-VII(a) and VII(b)-VII(b) of FIG. 5, respectively. In FIGS. 7(a) and 7(b), a bobbin 130 of insulating material with a solenoid coil 102 wound thereon and an insulation layer 131 between a guard ring 105 and a wing are specifically shown. As shown in FIG. 7(a), the guard ring 105 and the wing portion of the signal electrode 103 are opposed through the insulation layer 131. Also capacitors 107, 108 are connected between the wings.

In the vertical-magnetic field type MRI apparatus, in general, the nuclear magnetic resonant frequency is low, but since the slot-resonator coil is suitable for the operation at high frequency, when it is used in the vertical magnetic field type MRI apparatus, lowering of the resonant frequency without deteriorating the characteristics may become a problem. The settling measure will be described as follows.

Figure 8:
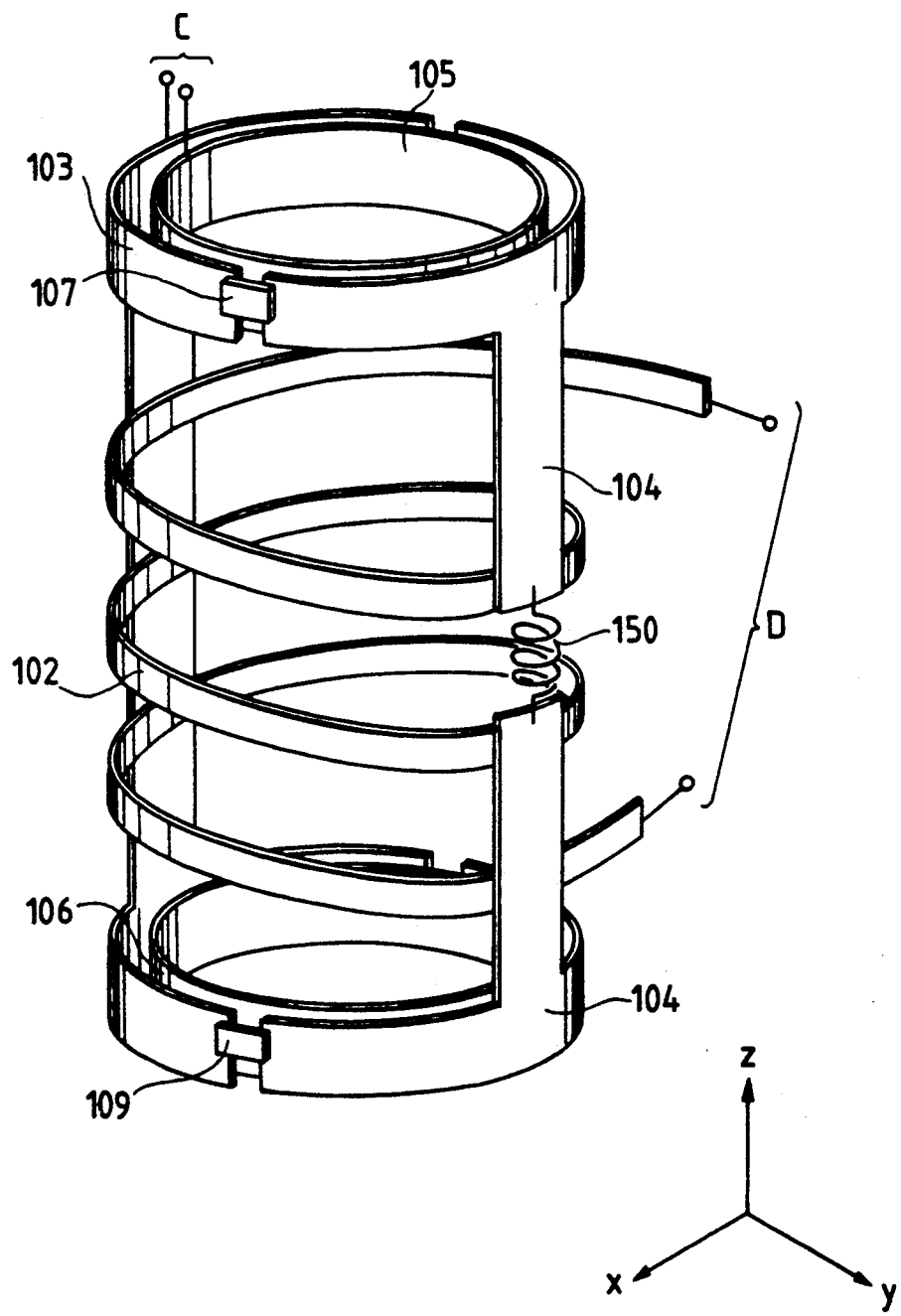
FIG. 8 is a bird's eye view showing a receiving coil being the main part of another embodiment of the invention.

FIG. 8 shows an embodiment of constitution where one arm section of the slot-resonator coil of the QD probe for the vertical-magnetic field type MRI apparatus shown in FIG. 5 is divided and has an inductance 150 added thereto. When the inductance 150 is added as shown in FIG. 8, the self-resonant frequency of the slot-resonator coil can be lowered thereby the resonant frequency of the QD probe can be lowered without deteriorating the characteristics.

Also in the case of the cross coil system as shown in FIG. 4 where the transmitting and the receiving are performed in separate coils, the coupling between the transmitting coil and the receiving coil becomes a problem.

Figure 10:
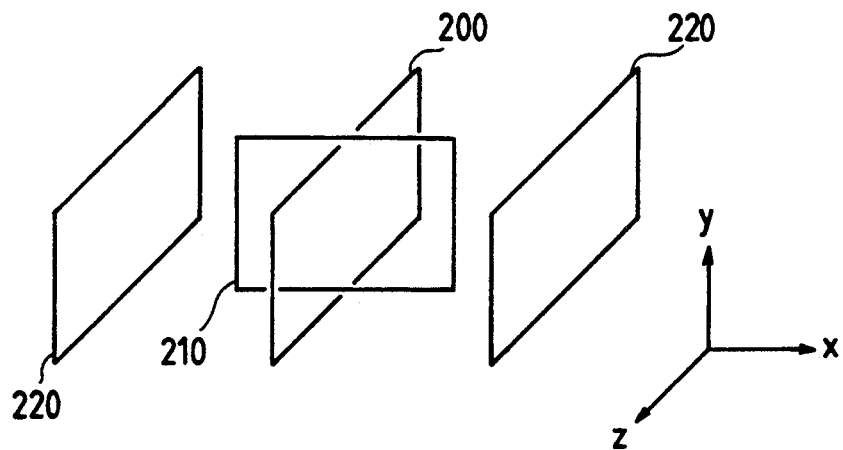
FIGS. 10 and 11 are diagrams illustrating the principle of a cross coil system.

The coupling between the transmitting coil and the receiving coil in the cross coil system will be described. Now, the position relation in each coil is noticed and simplification is performed as shown in FIG. 10. In FIG. 10, a coil 210 represents a solenoid coil of FIG. 8, and a coil 200 represents a slot-resonator coil of FIG. 8. A coil 220 represents a transmitting coil. The position relation of the coils 200, 210, 220 becomes the position shown in FIG. 10 or FIG. 11 (the coil 220 being in parallel to the coil 200 or the coil 210) in practice. (Existence of the transmitting direction within the xz plane is possible from the principle of NMR, but the position relation in practice becomes as shown in FIG. 10 or FIG. 11 from the position relation with the human body inserting direction or the receiving coil.)

In FIG. 10, the sensitivity direction of the solenoid coil 210 is in the z-axis direction and the sensitivity direction of the slot-resonator coil 200 is in the x-axis direction, and the transmitting direction of the transmitting coil 220 is in the x-axis direction. Consequently, a large signal transmitted from the transmitting coil 220 is inputted directly to the slot-resonator coil 200. Also a problem of the coupling occurs that the slot-resonator coil becomes an inductive load for the transmitting coil 220. In the arrangement in FIG. 11, a similar problem of the coupling occurs between the transmitting coil 220 and the solenoid coil 210.

Figure 9:
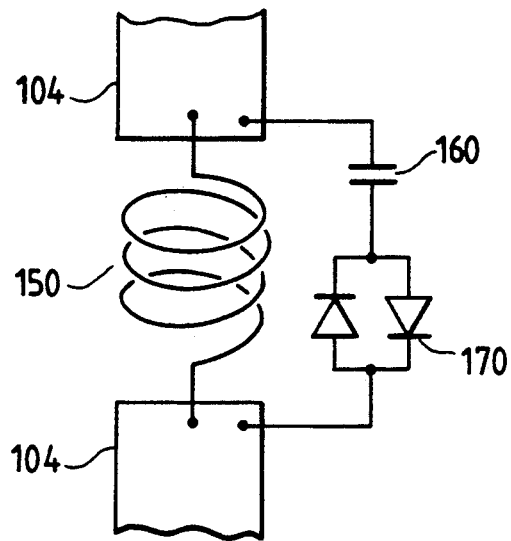
FIG. 9 is a circuit diagram showing a part of a receiving coil being the main part of a further embodiment of the invention.

FIG. 9 shows the decoupling means for solving the problem of the coupling between the transmitting coil and the slot-resonator coil produced by the arrangement of FIG. 10. That is, the signal electrode 104 of the slot-resonator coil shown in FIG. 8 is divided, and the inductance 150 is added thereto and further a capacitor 160 and paired diodes 170 are added in parallel to the inductance 150. Since the large voltage is applied across the inductance 150 during the transmitting, the paired diodes 170 are rendered conductive. If the paired diodes 170 become conductive, the inductance 150 and the capacitor 160 constitute the resonant circuit and the impedance across the inductance 150 becomes large, thereby the signal electrode 104 becomes equivalent to the cut state apparently. If the signal electrode 104 is cut, the slot-resonator coil become an open loop and therefore does not become an inductive load of the transmitting coil 220 and the transmitting signal is not inputted. On the other hand, since only a small voltage is applied across the inductance 150 during the receiving, the paired diodes 170 become non-conductive thereby the inductance 150 and the capacitor 160 do not constitute the resonant circuit. Consequently, the signal electrode 104 becomes non-cut state and acts as the slot-resonator coil and receives signals.

Figure 11:
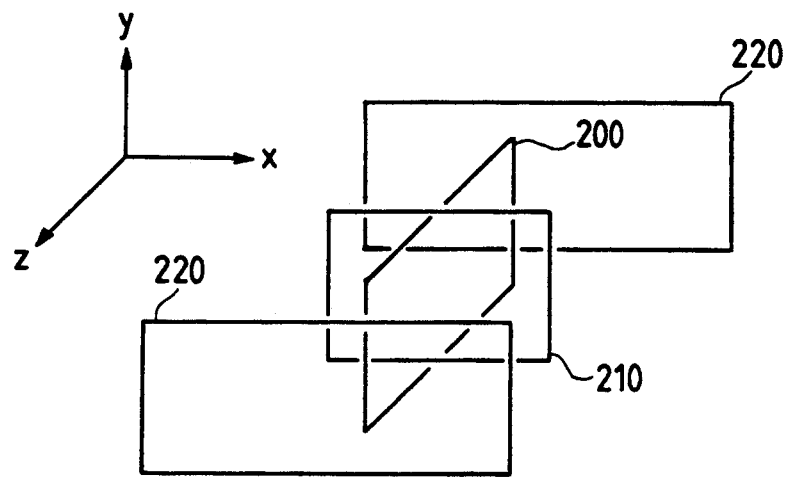
Figure 12:
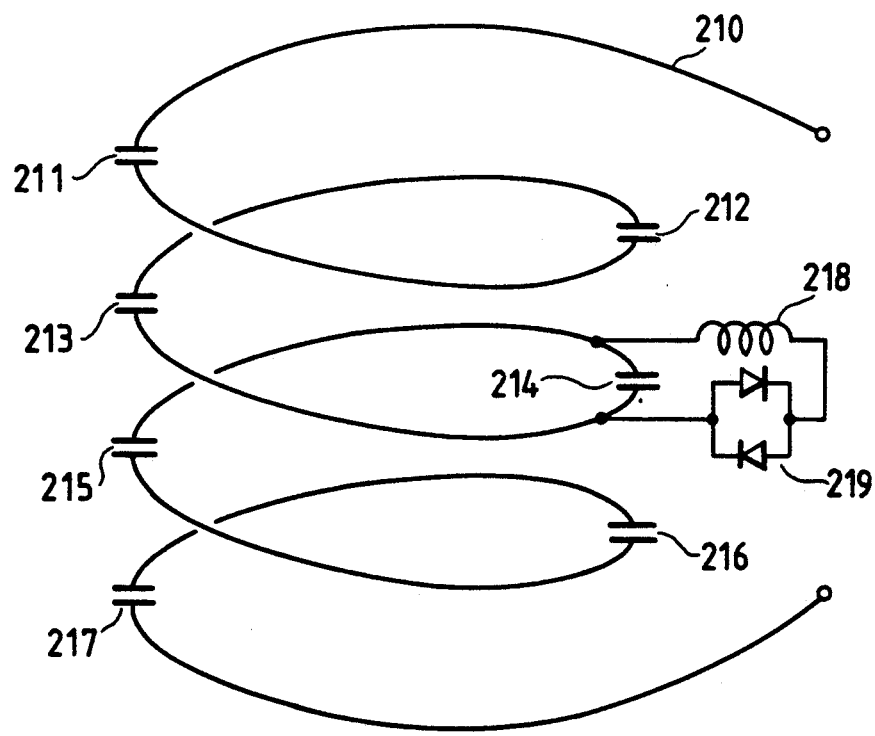
FIG. 12 is a circuit diagram showing a part of a receiving coil being the main part of still another embodiment of the invention.

Next, FIG. 12 shows the decoupling means for solving the problem of the coupling between the solenoid coil 210 and the transmitting coil 220 produced in the case of the arrangement shown in FIG. 11. As shown in FIG. 12, the solenoid coil 210 is divided by capacitors 211-217. By dividing the solenoid coil 210 by the capacitors 211 - 217, the influence during the human body inserting can be reduced. When the solenoid coil is is divided by the capacitors in such manner, for example, inductance 218 and paired diodes 219 are connected in parallel to the capacitor 214 and the resonant circuit is constituted, thereby the coupling with the transmitting coil can be avoided in similar manner to the above-mentioned principle.

Figure 13:
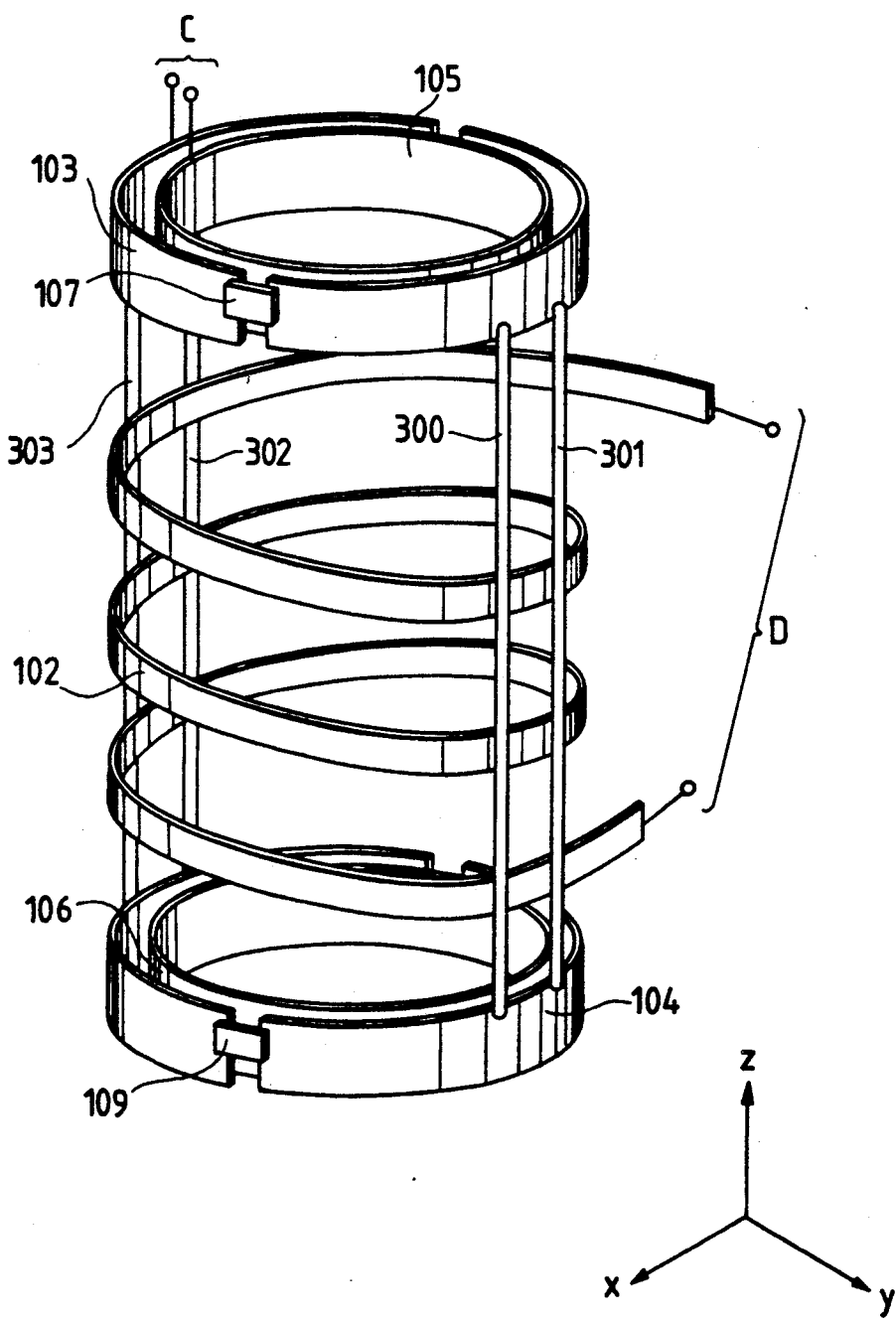
FIG. 13 is a bird's eye view showing a receiving coil being the main part of still further embodiment of the invention.

When the solenoid coil and the slot-resonator coil are combined, the coupling occurs between both coils and a problem of deterioration of the performance as the QD coil occurs. When the solenoid coil and the slot resonator coil are combined, it is characterized in that the overlapping in the signal detection section is small and the mutual influence is small. However, the mutual influence can be further reduced by following manner. That is, as shown in FIG. 13, among the signal electrodes of the slot-resonator coil, a part for substantially receiving signals (a part in parallel to the z-axis, called an "arm") is constituted by a slender conductor such as a copper rod and the like. Then since the width of the arm affects the sensitivity distribution during the receiving, as shown in FIG. 13, the two arm units are constituted by copper rods 300, 301 or 302, 303, each in two rods. In this constitution, the signal detection can be performed without changing the arm width substantially.

Figure 14:
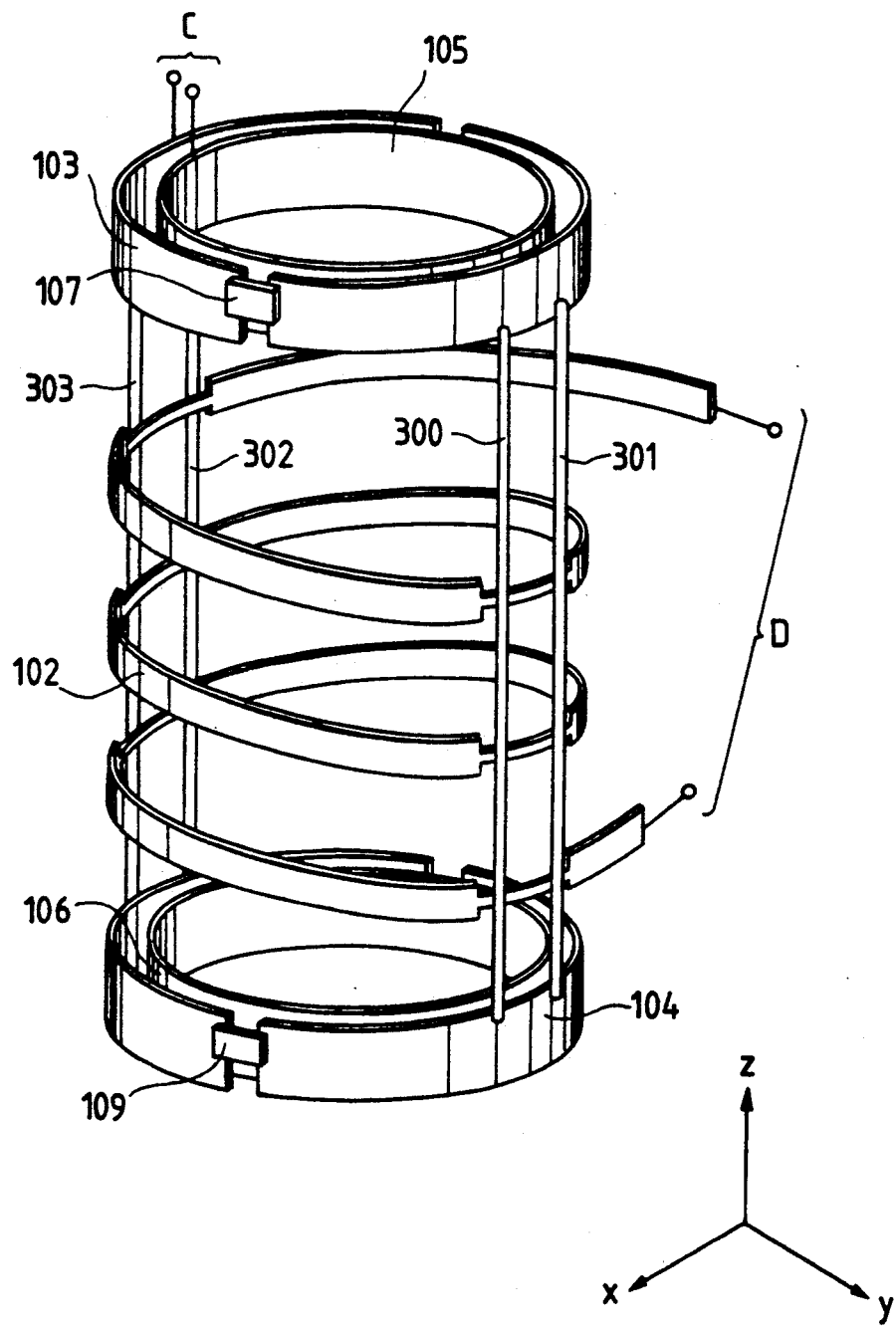
FIG. 14 is a bird's eye view showing a receiving coil being the main part of another embodiment of the invention.

Further as shown in FIG. 14, a portion at the side of the solenoid coil opposed to the arm unit is thinned, thereby the coupling between the solenoid coil and the slot-resonator coil can be further reduced.

We claim:

1. A nuclear magnetic resonance imaging apparatus comprising:

static magnetic field generation means for generating a static magnetic field in a cylindrical space having an axis along a first direction, said static magnetic field generation means generating said static magnetic field in a second direction perpendicular to the first direction;

a quadrature-phase detection probe for detecting a high-frequency magnetic field caused by nuclear magnetic resonance in said cylindrical space, said quadrature-phase detection probe including a slot-resonator coil and a solenoid coil;

said slot-resonator coil having two conductive arms extending in parallel to the axis of said cylindrical space and positioned on opposite sides of the axis of said cylindrical space so as to be spaced apart from each other in the second direction, one of said two conductive arms having ends thereof capacitively coupled to corresponding ends of the other of said two conductive arms so that said slot-resonator coil has a sensitivity enabling detection of a high-frequency magnetic field component in a third direction perpendicular to the first and second directions; and said solenoid coil including a coil member wound around a circumference of said cylindrical space so that said solenoid coil has a sensitivity enabling detection of a high-frequency magnetic field component in the first direction.

2. A nuclear magnetic resonance imaging apparatus according to claim 1, wherein at least one of said two conductive arms of said slot-resonator coil is divided into two parts, and further comprising an inductance connecting the divided parts.

3. A nuclear magnetic resonance imaging apparatus according to claim 1, further comprising:

high-frequency magnetic field generation means for generating a high-frequency magnetic field in the third direction perpendicular to the first and second directions in the cylindrical space; and decoupling means providing in a current path in said slot-resonator coil for enabling decoupling.

4. A nuclear magnetic resonance imaging apparatus according to claim 3, wherein said decoupling means includes a series circuit of a capacitor and a switching element, and an inductance connected in parallel with said series circuit, said capacitor and said inductance resonating at a frequency of said high-frequency magnetic field generated by said high-frequency magnetic field generation means when said inductance enables coupling to said capacitor through said switching element.

5. A nuclear magnetic resonance imaging apparatus according to claim 4, wherein said switching element includes a pair of diodes connected in parallel to each other and having polarities opposite to each other, said pair of diodes presenting a low impedance under a voltage induced by said high-frequency magnetic field generated by said high-frequency magnetic field generation means and being in a non-conductive state under a voltage induced by said high-frequency magnetic field generated by said nuclear magnetic resonance.

6. A nuclear magnetic resonance imaging apparatus according to claim 1, wherein a portion of at least one of said coil member of said solenoid coil and at least one of said conductive arms of said slot-resonator coil at overlapped portions of said coil member and said at least one of said conductive arms is thinner in comparison with other portions thereof.

7. A nuclear magnetic resonance imaging apparatus according to claim 1, wherein each of said two conductive arms includes at least one slender conductor.

8. A nuclear magnetic resonance imaging apparatus according to claim 7, wherein said slender conductor is a copper rod.

9. A nuclear magnetic resonance imaging apparatus according to claim 1, further comprising:

high-frequency magnetic field generation means for generating a high-frequency magnetic field in the first direction in the cylindrical space; and decoupling means provided in a current path in said solenoid coil for enabling decoupling.

10. A nuclear magnetic resonance imaging apparatus according to claim 9, wherein said decoupling means includes a series circuit of an inductance and a switching element, and a capacitor connected in parallel with said series circuit, said capacitor and said inductance resonating at a frequency of said high-frequency magnetic field generated by said high-frequency magnetic field generation means when said capacitor enables coupling to said inductance through said switching element.

11. A nuclear magnetic resonance imaging apparatus according to claim 10, wherein said switching element includes a pair of diodes connected in parallel to each other and having polarities opposite to each other, said pair of diodes presenting a low impedance under a voltage induced by said high-frequency magnetic field generated by said high-frequency magnetic field generation means and being in a non-conductive state under a voltage induced by said high-frequency magnetic field caused by said nuclear magnetic resonance.

* * * * *